PARALLEL HIGH FREQUENCY AMPLIFIER CIRCUITS

Filed Dec. 23, 1958 3 Sheets-Sheet 1

INVENTOR
R. KOMPFNER
BY [signature]
ATTORNEY

Feb. 13, 1962 R. KOMPFNER 3,021,490

PARALLEL HIGH FREQUENCY AMPLIFIER CIRCUITS

Filed Dec. 23, 1958 3 Sheets-Sheet 2

INVENTOR
R. KOMPFNER
BY [signature]
ATTORNEY

Feb. 13, 1962 R. KOMPFNER 3,021,490

PARALLEL HIGH FREQUENCY AMPLIFIER CIRCUITS

Filed Dec. 23, 1958 3 Sheets-Sheet 3

INVENTOR
R. KOMPFNER
BY [signature]
ATTORNEY

United States Patent Office 3,021,490

Patented Feb. 13, 1962

3,021,490
PARALLEL HIGH FREQUENCY AMPLIFIER CIRCUITS

Rudolf Kompfner, Holmdel, N.J., assignor to Bell Telephone Laboratories, Incorporated, New York, N.Y., a corporation of New York Filed Dec. 23, 1958, Ser. No. 782,423
3 Claims. (Cl. 330—53)

This invention relates to power amplifiers for operation at microwave frequencies and more particularly to amplifying arrangements wherein a plurality of microwave amplifiers are connected in parallel to obtain high power output.

In most microwave communication systems wherein essentially continuous wave transmission is employed, the high directivity obtainable with known antenna systems is such that relatively low power output is required in each transmitter. Similarly, in pulse systems the output power available is sufficient so that amplification of the output of the pulse generator is not required. There are, however, possible systems wherein high powers are required continuously at microwave frequencies. Where such powers are not available from the radio frequency oscillators, radio frequency amplification is required. Here also, however, severe limitations are placed on the available power level by the inherent limitations of available microwave frequency amplifiers.

An obvious solution to the problem of obtaining sufficient output power level is the connection of a plurality of microwave amplifiers in parallel. This can, of course, be accomplished through the use of hybrid circuits and more particularly the well-known waveguide hybrid junctions or magic-T circuits. It is found, however, that it is almost impossible to balance the arms connected in parallel by way of the hybrid junctions, and as a result, unbalanced currents flow around the loop and are dissipated in the terminations of the junctions. It can be shown, for example, that if the two branches including the microwave amplifiers do not have identical phase characteristics, a power loss will occur in one of the dissipative terminations of the hybrid junctions employed. If absolute identity of phase characteristics could be provided, power loss could still occur as a result of different gain characteristics.

It is, therefore, the object of the present invention to improve the efficiency of microwave amplifiers, particularly those of the kind wherein two or more amplifier tubes are connected in parallel.

In accordance with the invention, therefore, there is provided a plurality of branch circuits interconnecting a source of microwave signals and an output circuit. Each of the individual branches includes a microwave frequency amplifier and each amplifier is provided with an automatic gain control loop whereby the output of the amplifier is held in predetermined relationship to the input. Further, each amplifier is furnished with a phase lock loop which causes its output to follow the instantaneous frequency of the input. Thus both the phase and amplitude characteristics of the individual amplifiers are compensated.

The above and other features of the invention will be considered in detatil in the following specification taken in connection with the drawings wherein.

Figure 1:
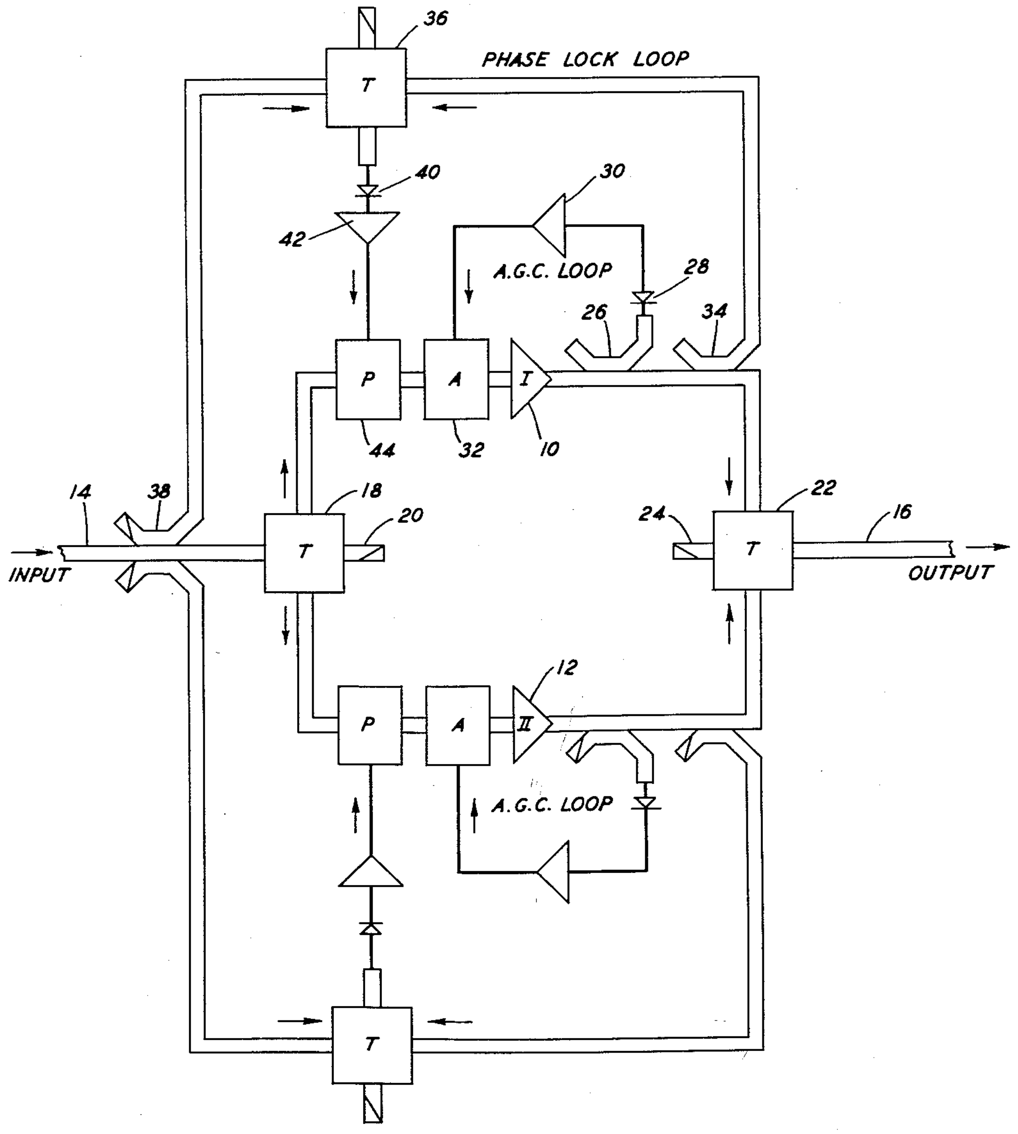
FIG. 1 is a schematic diagram in block form of a stabilized bridge amplifier circuit wherein two microwave amplifiers are connected in parallel.

As shown in FIG. 1, a pair of microwave amplifiers 10 and 12 is provided to accept an input signal of microwave frequency applied at an input 14 and to deliver the same signal at increased power level to an output circuit 16. Each of amplifiers 10 and 12 may, for example, be a wide band traveling wave tube amplifier although any other amplifier of suitable frequency and bandwidth capability for the particular application may, of course, be employed. Input signals appearing in circuit 14 are applied to the inputs of amplifiers 10 and 12 by way of a waveguide hybrid junction 18 of conventional design. Thus the input circuits of amplifiers 10 and 12 are connected to conjugate arms of junction 18 by way of additional circuit elements, the function of which will be considered hereinafter. The fourth arm of the hybrid is terminated in an impedance match 20 in accordance with known practice. In a similar fashion, the outputs from amplifiers 10 and 12 are combined in a second waveguide hybrid junction 22, the fourth arm of which includes a dissipative termination 24. Such circuit arrangements are well known in the art and it has been found that unless all elements, including the hybrid junctions, are identical and have identical transmission characteristics both as to phase and amplitude, unbalanced signals will flow around the bridge, including the two hybrid junctions and the two amplifiers. Thus it can be seen that a difference in phase characteristic can result in a power loss. If the power reaching the output hybrid junction 22 from amplifier 10 is taken as W and that from amplifier 12 as $W+\Delta W$, with a radio frequency phase shift $\varphi$ relative to the phase of the output of amplifier 10, then the combined output power $W_o$ is given by the expression $$W_o=W+\tfrac{1}{2}\Delta W+\cos\varphi\sqrt{W(W+\Delta W)} \qquad (1)$$

On the other hand, the power lost, which appears on the unbalanced arm 24 of junction 22, is given by the expression $$W_L=W+\tfrac{1}{2}\Delta W-\cos\varphi\sqrt{W(W+\Delta W)} \qquad (2)$$

If the square root term is expanded and only low order terms are retained, these expressions may be rewritten as follows:

$$W_o=2W\left[\cos^2\phi/2\left(1+\frac{\Delta W}{2W}\right)-\cos\phi\cdot\frac{1}{16}\left(\frac{\Delta W}{W}\right)^2\right] \qquad (3)$$

$$W_L=2W\left[\sin^2\phi/2\left(1+\frac{\Delta W}{2W}\right)+\cos\phi\cdot\frac{1}{16}\left(\frac{\Delta W}{W}\right)^2\right] \qquad (4)$$

If now, each amplifier is provided with instantaneous automatic gain control, the effect of which is to make $\Delta W$ approach zero, then the phase difference between the two amplifiers will give rise to an output $$W_o=2W.\cos^2\varphi/2 \qquad (5)$$

shifted in phase by $\tfrac{1}{2}\varphi$.

In a similar fashion, it can be shown that if each amplifier is provided with equipment to lock the phase of its output to that of its input so that the phase angle $\varphi$ equals zero under all conditions then a difference in the power of the two amplifiers will result in a power loss as shown by the expression $$W_L=2W\left[\frac{1}{16}\left(\frac{\Delta W}{W}\right)^2-\frac{1}{32}\left(\frac{\Delta W}{W}\right)^3+\ldots\right] \qquad (6)$$

According to the invention, therefore, each of amplifiers 10 and 12 is provided with means for insuring that its output power will bear a fixed relationship to the input power and that these quantities will be the same for the two amplifiers. Further, each amplifier is provided with means for insuring that the phase of its output will be faithfully representative of the phase of the individual signal. Thus the output of amplifier 10 is connected through a directional coupler 26 to a side branch including an automatic gain control detector which may comprise a crystal rectifier 28 connected in the branch wave guide in conventional manner. The direct current derived from detector 28 is applied by way of an amplifier 30 to an amplitude-modulating device 32 introduced in the wave guide between hybrid junction 18 and amplifier 10. This may be a conventional diode modulator, for example, or if amplifier 10 is a traveling wave tube, the output of the amplifier 30 is applied as a modulating signal to adjust the amplitude of the input signal to amplifier 10 proportionately to maintain the output power level at a fixed relationship to the input power. If amplifier 10 is a traveling wave tube amplifier, separate modulator 32 is not required and the output of AGC amplifier 30 may be employed to adjust the beam current to obtain the desired adjustment of output amplitude.

Amplifier 10 is also provided with an automatic phase lock circuit which may take any of a large number of forms represented by the prior art. The exact nature of the automatic phase lock circuit will depend in great measure upon the amplifier used and upon other characteristics of the system. In FIG. 1, however, there is shown a representative phase lock circuit which includes the several elements required in any such circuit. Thus a sample of the output of amplifier 10 is abstracted by way of a directional coupler 34 and applied to one arm of a waveguide hybrid junction 36. In addition, a sample of the input signal is abstracted from input circuit 14 by way of a directional coupler 38 and applied to the arm of hybrid junction 36, which is conjugate to the arm to which the output of coupler 34 is connected. Of the other pair of arms of hybrid junction 36, one is terminated and the other includes a diode 40 providing a direct-current output variation in accordance with differences in the phase of the two applied signals. This direct-current output is amplified in an amplifier 42 and applied to a phase modulator 44 connected in series in the input circuit of amplifier 10. This phase modulator may, as did amplitude modulator 32, comprise a diode element inserted in the wave guide or, if amplifier 10 is of the traveling wave tube variety, may be dispensed with as a separate unit. Here, the phase of the traveling wave tube output is simply controlled by varying the beam voltage in accordance with the output of amplifier 42.

Although the control arrangements for amplifier 10 have been considered above, it will be understood that those associated with amplifier 12 are identical to those for amplifier 10 and no detailed description thereof will be given.

Figure 2:
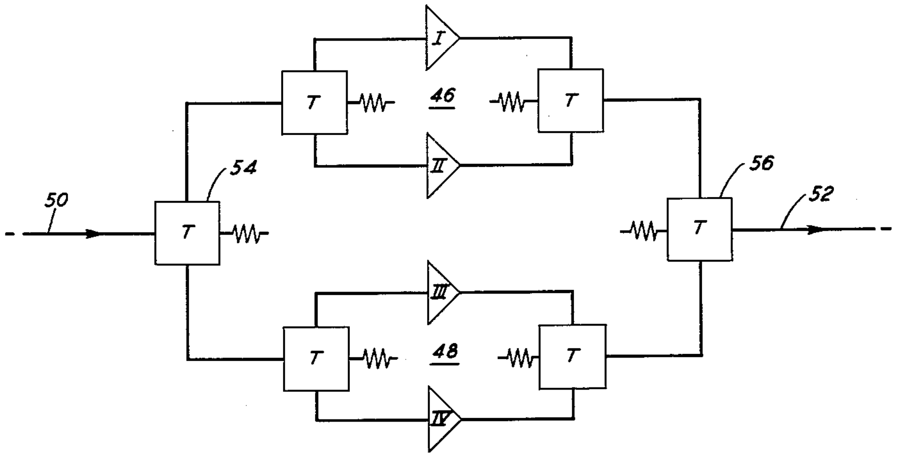
FIG. 2 is a schematic diagram illustrating the interconnection of a plurality of bridge amplifiers of the kind disclosed in FIG. 1 to obtain greater power gains.

Since both the phase and amplitude characteristics of the two amplifiers connected in parallel, as shown in FIG. 1, are compensated with reference to the input signal applied to both of the amplifiers, it follows that two or more bridge arrangements of the kind shown in FIG. 1 may themselves be connected in parallel by way of hybrid junctions, as shown in FIG. 2. Here, amplifier bridges 46 and 48, each of which may be identical to that shown in FIG. 1, are connected in parallel between input circuit 50 and output circuit 52 by way of hybrid junctions 54 and 56. Here, the compensation required for each of amplifier bridges 46 and 48 serves not only to balance the contributions of the component amplifier stages within the bridge but also, because the control is derived from the input signal applied to all amplifiers, to balance the contributions of the two bridges of the output.

Figure 3:
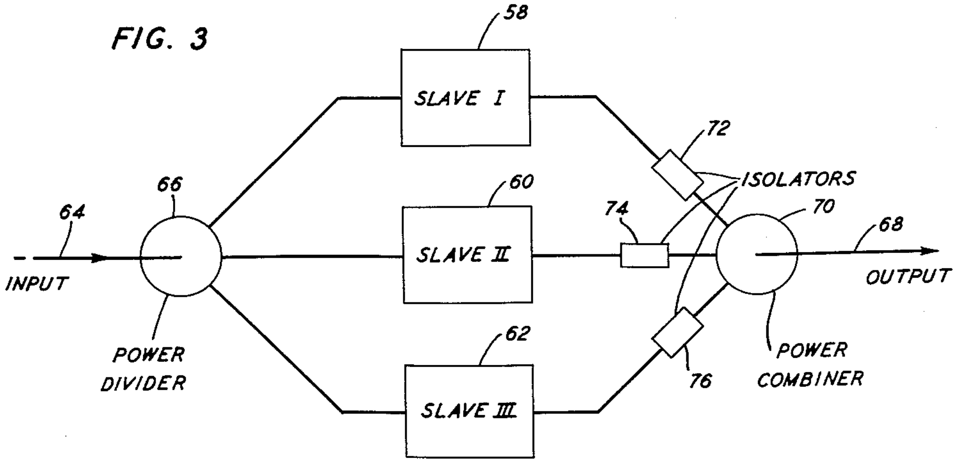
FIG. 3 is a schematic diagram of an arrangement suitable for use in accordance with the invention when the required gain can be obtained with an odd number of individual amplifiers.

There may be instances where the desired output power can be obtained by the parallel interconnection of an odd number of microwave amplifiers rather than the $2^n$ amplifiers contemplated by the arrangements thus far described. In these instances, the arrangements shown in FIG. 3 may be employed. Here, each of amplifiers 58, 60, and 62 is identified as a "slave" amplifier and their inputs are connected to a microwave input circuit 64 by way of a power dividing network 66 of any convenient arrangement. Similarly, the outputs of the three slave amplifiers are connected to an output circuit 68 by way of a power-combining network 70 which also may be of any convenient type. If, as may sometimes occur, one of the slave amplifiers fails, interaction of the others may be minimized by microwave isolators 72, 74, and 76, respectively, in the circuits interconnecting the outputs of the three slave amplifiers to the power combining network 70.

Figure 4:
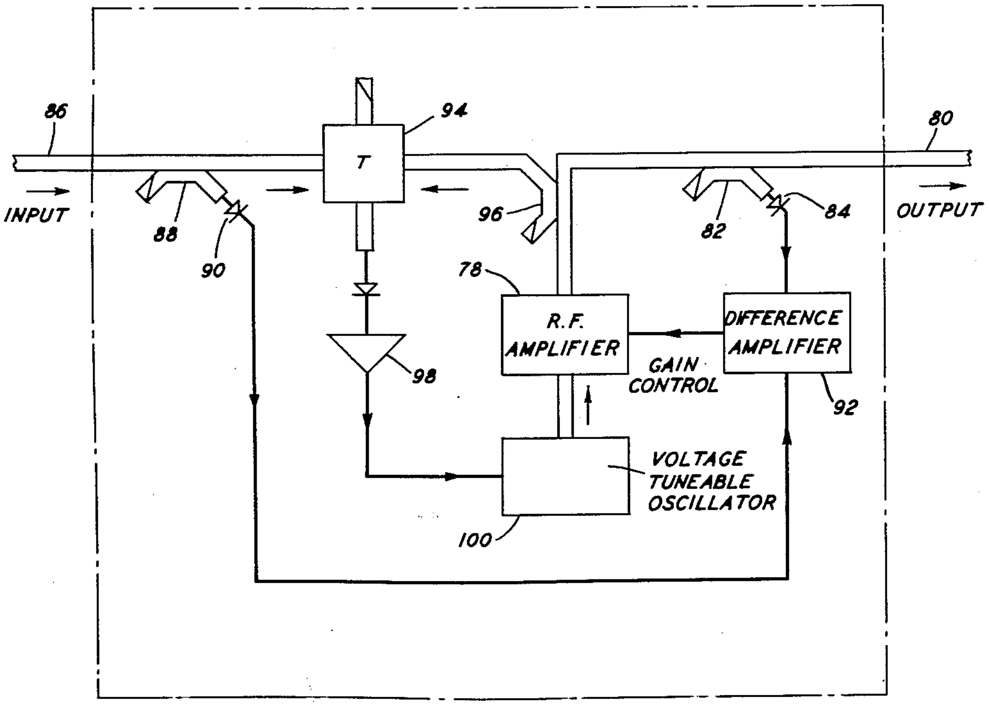
FIG. 4 is a schematic diagram in block form of a slave amplifier suitable for use in the arrangement of FIG. 3.

As in the arrangements shown in FIGS. 1 and 2, each of the slave amplifiers is so arranged that the output power level and the output phase are held in predetermined relationship to the corresponding quantities of the applied input signal. That is, the output of the amplifier circuit is "slaved" to the input. To this end, each slave amplifier may be arranged as shown in FIG. 4 of the drawings. Here, a radio frequency amplifier is represented at 78 and its output is connected to an output circuit 80 by way of waveguide or other transmission means. A sample of the output is abstracted by a directional coupler 82 and rectified by a diode 84 to provide a direct current representative of the output level. In similar fashion, a sample of applied signal at input circuit 86 is abstracted by a directional coupler 88 and rectified by a diode 90 for application as a second direct current to a difference amplifier 92. Difference amplifier 92 is a conventional differential amplifier and provides an output, the amplitude and polarity of which are determined by the relative contributions of the two applied signals. This output is applied as a gain control voltage to microwave amplifier 78 in much the same fashion as the gain control signals are applied to the amplifiers of FIG. 1.

Phase control is obtained in the present arrangement in a somewhat different manner from that employed where the number of amplifiers connected in parallel is even. Thus the input signal is applied to one branch of a waveguide hyvrid junction 94 to the conjugate arm of which is applied a sample of the output of amplifier 78 derived by way of a directional coupler 96. The output appearing at a third arm of hybrid junction 94 is rectified to provide a direct-current voltage which varies with the difference in phase between the two applied signals. This voltage is amplified in an amplifier 98 and applied as a control quantity for a voltage tunable oscillator 100. The output of this oscillator is thus caused to follow in phase and frequency the input signal applied at input 86.

Although circuit arrangements have been shown for specific embodiments of the invention, it will be understood that the arrangements required will vary widely, depending upon the nature of the microwave amplifiers employed and the nature of the input signals to be amplified. The circuit arrangements described above are intended primarily for those instances in which the input signal is frequency modulated. It will be evident, however, that the circuits may readily be modified, for instance, where amplitude modulation, pulse modulation, or other input signals are employed.

What is claimed is:

1. In an amplifier for microwave signals arranged for connection in parallel with other similar amplifiers, a microwave amplifier stage, an output circuit therefor, means for sampling the amplitude of the signal in said output circuit, a source of microwave signals to be amplified, means for sampling the amplitude of said microwave signals, means for comparing the two amplitude samples to derive a control signal, means applied to the input circuit of said amplifier for adjusting the gain of said amplifier in response to said control signal, and means for adjusting the phase of the output signal from said amplifier to match that of the microwave signals to be amplified, said phase adjusting means including means for sampling the phase of said output signal, means for sampling the phase of said microwave signals to be amplified, means comparing the outputs of said two phase sampling means for developing a control quantity representative of the phase difference between said samples, a voltage tunable oscillator connected to the input of said amplifier for determining the frequency of said amplifier, and means for applying said control quantity to said oscillator for varying the phase and frequency of said oscillator in correspondence with said microwave signals.

2. In combination, a plurality of amplifier circuits as defined in claim 1 wherein said amplifier circuits are arranged in parallel with one another and supplied by a single source of microwave signals to be amplified, a power-dividing network connected between said source of microwave signals to be amplified and each of said amplitude sampling means to supply microwave signals to said amplitude sampling means, and a power-combining network connected between each of said output circuits and a common output to supply said output signals to said common output.

3. A circuit configuration as defined in claim 2 wherein isolators are connected between each of said output circuits and said power-combining network.

References Cited in the file of this patent

UNITED STATES PATENTS

| | | |
|---|---|---|
| 2,540,640 | Young | Feb. 6, 1907 |
| 2,546,837 | Stribling | Mar. 27, 1951 |
| 2,592,716 | Lewis | Apr. 15, 1952 |
| 2,719,191 | Hermes | Sept. 27, 1955 |
| 2,847,517 | Small | Aug. 12, 1958 |

FOREIGN PATENTS

| | | |
|---|---|---|
| 948,167 | Germany | Aug. 30, 1956 |